(12) United States Patent
Nishimura et al.

(10) Patent No.: US 6,810,687 B2
(45) Date of Patent: Nov. 2, 2004

(54) METHOD FOR PRODUCING SYNTHETIC QUARTZ GLASS MEMBERS FOR EXCIMER LASERS

(75) Inventors: Hiroyuki Nishimura, Koriyama (JP); Toru Yokota, Koriyama (JP); Akira Fujinoki, Koriyama (JP)

(73) Assignees: Heraeus Quarzglas GmbH & Co. KG., Hanau (DE); Shin-Etsu Quartz Products Co., Ltd., Tokyo (JP)

(*) Notice: Subject to any disclaimer, the term of this patent is extended or adjusted under 35 U.S.C. 154(b) by 193 days.

(21) Appl. No.: 10/076,034

(22) Filed: Feb. 13, 2002

(65) Prior Publication Data

US 2003/0027705 A1 Feb. 6, 2003

(30) Foreign Application Priority Data

Feb. 15, 2001 (JP) ........................................ 2001-038112

(51) Int. Cl.[7] .............................................. C03C 21/00
(52) U.S. Cl. ........................................ 65/29.15; 65/32.1
(58) Field of Search .......................... 65/379, 384, 424, 65/17.4, 17.5, 32.1, 29.15, 29.19, 157; 501/54; 264/234

(56) References Cited

U.S. PATENT DOCUMENTS

| | | | | |
|---|---|---|---|---|
| 5,410,428 A | * | 4/1995 | Yamagata et al. | 359/350 |
| 5,616,159 A | * | 4/1997 | Araujo et al. | 65/17.4 |
| 5,668,067 A | * | 9/1997 | Araujo et al. | 501/54 |

(List continued on next page.)

FOREIGN PATENT DOCUMENTS

| | | | | |
|---|---|---|---|---|
| JP | 03-088742 | * | 4/1991 | ............. C03C/4/12 |
| JP | 03-088743 A | | 4/1991 | |
| JP | 06-166522 A | | 6/1994 | |
| JP | 2000-095535 A | | 4/2000 | |

OTHER PUBLICATIONS

Patent Abstracts of Japan for Janaese published application 06–166522 A (1994).

(List continued on next page.)

Primary Examiner—Peter Chin
Assistant Examiner—Carlos Lopez
(74) Attorney, Agent, or Firm—Tiajoloff & Kelly

(57) ABSTRACT

In the light of the disadvantages of the prior art technology, an object of the present invention is to provide a method for producing a synthetic quartz glass member for excimer lasers, which comprises, while suppressing the generation of reductive defects which impairs the resistance against laser radiations, incorporating a sufficient amount of hydrogen molecules capable of achieving a high resistance against laser radiation into the quartz glass, yet uniformly incorporating the hydrogen molecules to realize a flat distribution in refractive indices attributed to the distribution in the density of hydrogen molecules. It is also an object of the present invention to provide a synthetic quartz glass member for excimer lasers obtained by the production method above, which yields high resistance against laser radiations and homogeneity. The above problems have been overcome by a method for producing a synthetic quartz glass member for excimer lasers, which, in a method for producing a synthetic quartz glass member for excimer laser optics comprising a step of incorporating hydrogen molecules into a synthetic quartz glass body by heat treating the synthetic quartz glass body at a temperature of 600° C. or lower under an atmosphere in a pressure range of 1 atm or higher but lower than 150 atm and containing hydrogen, said method comprises varying the pressure of the gas containing hydrogen either continuously or stepwise in at least a part of the heat treatment.

7 Claims, 4 Drawing Sheets

U.S. PATENT DOCUMENTS

| | | | |
|---|---|---|---|
| 5,983,673 A | * 11/1999 | Urano et al. | 65/30.1 |
| 6,094,941 A | 8/2000 | Fujinoki et al. | |
| 6,339,033 B2 | * 1/2002 | Jinbo et al. | 501/54 |
| 2002/0194869 A1 | * 12/2002 | Borrelli et al. | 65/17.4 |
| 2003/0066309 A1 | * 4/2003 | Ueda et al. | 65/30.1 |

OTHER PUBLICATIONS

Patent Abstracts of Japan for Janaese published application 03–088743 A (1991).

* cited by examiner

Fig. 3

Results on the Evaluation of Physical Properties obtained in Examples and Comparative Examples

| | Example 1 | Example 2 | Example 3 | Example 4 | Example 5 | Comp. Example 1 | Comp. Example 2 |
|---|---|---|---|---|---|---|---|
| Average Hydrogen Concentration | $4.5 \times 10^{18}$ | $1.7 \times 10^{18}$ | $1.6 \times 10^{19}$ | $4.0 \times 10^{18}$ | $3.0 \times 10^{18}$ | $7.5 \times 10^{18}$ | $4.0 \times 10^{18}$ |
| ΔHydrogen concentration | $5.0 \times 10^{17}$ | $3.5 \times 10^{17}$ | $1.2 \times 10^{18}$ | $4.0 \times 10^{17}$ | $3.0 \times 10^{17}$ | $1.1 \times 10^{17}$ | $4.5 \times 10^{17}$ |
| Homogeneity (direction of diameter) | $\pm 0.9 \times 10^{-6}$ | $\pm 0.9 \times 10^{-6}$ | $\pm 1.5 \times 10^{-6}$ | $\pm 1.0 \times 10^{-6}$ | $\pm 0.9 \times 10^{-6}$ | $\pm 2.5 \times 10^{-6}$ | $\pm 1.0 \times 10^{-6}$ |
| Homogeneity (thickness direction) | $\pm 1.5 \times 10^{-6}$ | $\pm 1.2 \times 10^{-6}$ | $\pm 1.8 \times 10^{-6}$ | $\pm 1.5 \times 10^{-6}$ | $\pm 1.2 \times 10^{-6}$ | $\pm 1.8 \times 10^{-6}$ | $\pm 1.5 \times 10^{-6}$ |
| ArF RDP | 0.0015 | 0.0020 | 0.0023 | 0.0015 | 0.0012 | 0.0030 | 0.0130 |
| KrF RDP | 0.0035 | 0.0045 | 0.0050 | 0.0035 | 0.0032 | 0.0070 | 0.0310 |
| Stress | < 1.5 nm/cm | < 1.5 nm/cm | < 2 nm/cm | < 1.5 nm/cm | < 2 nm/cm | < 3 nm/cm | < 1.5 nm/cm |
| Size (diameter) | 240 | 240 | 240 | 240 | 240 | 240 | 240 |
| Size (thickness) | 40 | 45 | 25 | 40 | 50 | 40 | 40 |
| Hydrogen treatment method | two-step pressure | two-step pressure | three-step pressure | two-step pressure | three-step pressure | constant pressure | two-step pressure |
| Type of quartz glass | Soot material | DQ material | DQ material | Soot material | Soot material | Soot material | Soot material |
| Hydrogen treatment temperature | 350 °C | 400 °C | 350 °C | 350 °C | 350 °C | 400 °C | 650 °C |
| First condition | | | | | | | |
| Pressure (atm) | 30 | 10 | 100 | 30 | 30 | 30 | 30 |
| Time (hours) | 600 | 350 | 120 | 600 | 550 | 600 | 130 |
| Second condition | | | | | | | |
| Pressure (atm) | 8 | 2.5 | 50 | 8(H2)/22(H3) | 4 | | 8 |
| Time (hours) | 550 | 300 | 85 | 550 | 500 | | 120 |
| Third condition | | | | | | | |
| Pressure (atm) | - | - | 25 | - | 10 | | |
| Time (hours) | - | - | 135 | - | 120 | | |

METHOD FOR PRODUCING SYNTHETIC QUARTZ GLASS MEMBERS FOR EXCIMER LASERS

INDUSTRIAL FIELD OF APPLICATION

The present invention relates to a synthetic quartz glass member for optics having excellent optical transmittance, homogeneity, and stability with respect to the irradiation of a high intensity ultraviolet radiation, in particular, to those of KrF and ArF excimer lasers. More specifically, the synthetic quartz glass members according to the present invention relate to those favorably applicable to lenses of aligners and other optical components for use in lithography using excimer lasers for producing semiconductor chips, as well as for prisms used in narrowing bands of excimer lasers, other general use optical members utilized in KrF and ArF excimer laser radiations, lenses, beam splitters, prisms, etc.

PRIOR ART

Recently, practical LSIs are being produced by KrF excimer laser lithography, and developments targeted to the realization of ArF excimer laser lithography for the next generation exposure technology are in progress. Furthermore, improvements are also made on KrF lithography, such that the performance of patterning finer circuit patterns or the processing capability (throughput) per hour can be improved. More specifically, fine circuit patterns are now produced by employing improved exposure methods such as modified illumination method and phase shift masks, and this fundamentally requires an aligner equipped with a lens made from a material of higher performance. That is, a lens material having higher homogeneity and low birefringence is strongly demanded for accurate focusing. Furthermore, in order to improve the throughput, the quantity of exposure light for use in patterning is being increased by elevating the repetition frequency or the energy of the excimer laser. In such a case, the lens material tends to be optically damaged due to the increased quantity of light transmitted through the lens material of the aligner. At any rate, a quartz glass for use as the lens material with higher quality is required every year with the increase in performance of the aligner. The means now being taken based on prior art for improving homogeneity or for increasing laser resistance is found insufficient.

The technique for obtaining a quartz glass of high homogeneity has been studied in various fields, and many patents applications have been made thereon. In general, the homogeneity of an optical quartz glass signifies the uniformity in refractive index. Generally, a retardation in phase is measured by an interferometer using a He—Ne laser emitting a radiation 632.8 nm in wavelength to calculate the distribution in refractive indices. A highly uniform quartz glass lens material is necessary because an extremely high imaging performance is required on a lens for use in lithography. The refractive index changes depending on the impurities incorporated in the quartz glass, e.g., chlorine or hydroxyl groups, etc., or on the fictive temperature. Thus, if the quartz glass contains impurities distributed therein, the distribution of refractive indices changes depending thereon. For instance, a portion containing SiOH groups in a larger quantity yields a relatively low refractive index. The fictive temperature changes depending on the cooling rate in thermally treating quartz glass, and a distribution in refractive index is also formed due to the generation of a distribution in fictive temperature within the quartz glass. In JP-A-Hei3-88743 (the term "JP-A" as referred herein signifies "an unexamined published Japanese patent application") is disclosed a method for producing a glass of high homogeneity by positively combining the factors above inducing fluctuation in refractive index. Furthermore, the same published patent application describes a method of imparting high laser resistance to the quartz glass by thermally treating the glass in a hydrogen-containing atmosphere to thereby enable the doping of hydrogen molecules. That is, by doping glass with hydrogen, the technique enables obtaining a glass of high homogeneity while maintaining high resistance against an excimer laser radiation. Accordingly, since a high resistance against laser radiation can be imparted by applying hydrogen doping to a highly homogeneous quartz glass obtained by controlling the distribution of impurities such as SiOH and chlorine, it has been believed that such a material could be favorably used as a lens material for use in excimer laser lithography. In fact, however, there has been found practical problems such that (1) an even higher resistance against laser radiation is required recently in view of increased repetition times and higher energy used in laser, and (2) homogeneous doping of hydrogen molecules is difficult in view of the recent demand on larger materials having even higher NA. Thus, a material sufficiently satisfying the requirements cannot be obtained by a method described in the published patent application above. In particular, taking the diffusion coefficient of hydrogen molecules into consideration, it is extremely difficult to realize a large material uniformly doped with hydrogen molecules by performing heat treatment in an atmosphere containing hydrogen. In practice, there are problems as such that, by calculation, such a process requires an extremely long time of treatment or a hydrogen addition treatment at a considerably high temperature. Furthermore, from the studies to present, it has been found that hydrogen molecules also influence the distribution in refractive indices, and that uniformly doped hydrogen molecules make an important factor.

Homogenous hydrogen doping is important in obtaining a highly homogeneous quartz glass yet having high resistance against laser radiation, however, particularly in case of a large material, a long time duration is necessary to sufficiently diffuse hydrogen deep into the inside of the material. This results in a serious problem of impairing the productivity. Applying hydrogen doping at higher temperatures at which the diffusion coefficient of hydrogen becomes higher can shorten the time necessary for diffusing hydrogen. However, a quartz glass exposed to hydrogen at high temperatures tend to newly generate defects, and this is known to impair the resistance against laser radiation of the quartz glass. JP-A-Hei6-166522 describes the resistance against the irradiation of an ArF excimer laser of a hydrogen-doped material obtained by thermally treating synthetic quartz glass member trial produced materials at various temperatures under a gaseous hydrogen atmosphere. It shows that the material subjected to a heat treatment at high temperatures exceeding 600° C. yields an extremely impaired resistance against laser radiation. This is attributed to the fact that reductive defects generate inside the quartz glass due to the hydrogen molecules introduced at higher temperatures, which induce absorption in the ultraviolet region in case an excimer laser is irradiated thereto. The absorption thus induced is ascribed to paramagnetic defects generally denoted as E' centers, and yields an absorption band having its center wavelength in the range of from 210 to 215 nm. Thus, in order to suppress the generation of E' centers, i.e., to suppress the generation of induced absorption, the published patent application above describes the application of a heat treatment at a temperature not higher than 600° C. As described above, however, the diffusion coefficient for hydrogen decreases at lower temperatures, and this increases the process time in case of processing a large material as to impair the productivity. Accordingly, in order to introduce more hydrogen molecules into the quartz glass, the published patent above describes a treatment carried out under a high pressure of 1 atm or higher, preferably, 50 atm or higher. However, in general, the distribution of hydrogen molecule concentration for a quartz glass thus obtained yields, in accordance with the principle of a diffusion phenomenon, higher concentration values at the peripheral portions as compared with those at the central portion. In case of a treatment performed at higher pressures, in particular, it results in a larger difference as to greatly affect the homogeneity (in the distribution of refractive indices).

In JP-A-2000-95535 is disclosed a method of hydrogen doping under a high pressure, such that the formation of hydrogen concentration distribution is suppressed in such a manner that the homogeneity would not be affected. According to the published patent application, the method comprises doping hydrogen molecules under a pressure of 10 atm or higher, preferably, 50 atm or higher (second step), and performing heat treatment (third step), thereby selectively degassing the peripheral portion having a high hydrogen molecule concentration so as to obtain a quartz glass material having a uniform hydrogen concentration distribution. However, the method according to this published patent application requires applying heat treatment in two stages, i.e., a heat treatment for doping hydrogen (second step) and a subsequent heat treatment under an atmosphere free from hydrogen (third step). Furthermore, if the latter heat treatment should be performed at too high a temperature, it is known that the resistance against laser radiation is impaired by the newly formed defects. Accordingly, in case of selectively degassing the peripheral portion having high hydrogen concentration alone, the process should be performed at a relatively low temperature, and this requires a heat treatment performed for a long duration of time. Furthermore, the concentration and the distribution of hydrogen greatly fluctuate depending on the size of the molded body or on the conditions of the second step, and it was found quite difficult to obtain a hydrogen concentration with a flat distribution by selectively and properly degassing the peripheral portion alone in a simple heat treatment that is performed in the third step. As described above, an additional heat treatment performed after doping hydrogen was not so preferable from the viewpoints of resistance against laser radiation and from productivity.

PROBLEMS THAT THE INVENTION IS TO SOLVE

In the light of the disadvantages of prior art technology, an object of the present invention is to provide a method for producing a synthetic quartz glass member for excimer lasers in which, while suppressing the generation of reductive defects which impairs the resistance against laser radiations, incorporating a sufficient amount of hydrogen molecules capable of achieving a high resistance against laser radiation, yet uniformly incorporating the hydrogen molecules to realize a flat distribution in refractive indices attributed to the distribution in the density of hydrogen molecules. It is also an object of the present invention to provide a synthetic quartz glass member for excimer lasers obtained by the production method above, which yields high resistance against laser radiations and homogeneity.

MEANS FOR SOLVING THE PROBLEMS

The above objects are achieved by one of the constitutions described in (1) to (10) below.

(1) A method for producing a synthetic quartz glass member for excimer lasers, which, in a method for producing a synthetic quartz glass member for excimer laser optics comprising a step of incorporating hydrogen molecules into a synthetic quartz glass body by heat treating the synthetic quartz glass body at a temperature of 600° C. or lower under an atmosphere in a pressure range of 1 atm or higher but lower than 150 atm and containing hydrogen, said method comprises varying the pressure of the gas containing hydrogen either continuously or stepwise in at least a part of the heat treatment.

(2) A method for producing a synthetic quartz glass member for excimer lasers as described in (1) above, wherein the pressure of the gas containing hydrogen is decreased.

(3) A method for producing a synthetic quartz glass member for excimer lasers as described in (2) above, wherein the synthetic quartz glass body is heat treated under an atmosphere containing hydrogen for a first predetermined time duration under a pressure of first setting, and is further heat treated for a second predetermined time duration under a pressure of second setting that is lower than said pressure of first setting.

(4) A method for producing a synthetic quartz glass member for excimer lasers as described in one of (1) to (3) above, wherein the atmosphere containing hydrogen consists of 100% gaseous hydrogen or a mixed gas containing hydrogen together with nitrogen, argon, or helium.

(5) A method for producing a synthetic quartz glass member for excimer lasers as described in one of (1) to (4) above, wherein the synthetic quartz glass body in which hydrogen is incorporated is prepared by either a direct flame hydrolysis method or an indirect flame hydrolysis method.

(6) A synthetic quartz glass member for excimer lasers produced by a method for producing a synthetic quartz glass member for excimer lasers as described in one of claims 1 to 5, in which hydrogen is uniformly incorporated therein.

(7) A synthetic quartz glass member for excimer lasers as described in (7) above, wherein the average density of the hydrogen molecules is $1 \times 10^{18}$ molecules/cm$^3$ or higher, and the fluctuation in the density of hydrogen molecules is within a range of $\pm 1.2 \times 10^{18}$ molecules/cm$^3$.

(8) A synthetic quartz glass member for excimer lasers as described in (6) or (7) above, wherein, in case an ArF excimer laser radiation is irradiated thereto for a repetition of $2 \times 10^5$ pulses with an energy density per pulse of 2 mJ/cm$^2$ at a frequency of 200 Hz, the member yields an induced absorption under an irradiation wavelength of 215 nm of 0.003 or lower as expressed by absorbance for a thickness of 1 cm.

(9) A synthetic quartz glass member for excimer lasers as described in (6) or (7) above, wherein, in case a KrF excimer laser radiation is irradiated thereto for a repetition of $2 \times 10^5$ pulses with an energy density per pulse of 100 mJ/cm$^2$ at a frequency of 200 Hz, the member yields an induced absorption under an irradiation wavelength of 210 nm of 0.0075 or lower as expressed by absorbance for a thickness of 1 cm.

(10) A synthetic quartz glass member for excimer lasers as described in one of (7) to (9) above, wherein, under a radiation of 632.8 nm, it yields a homogeneity in refractive index of $\pm 4 \times 10^{-6}$ (/cm) or lower and a birefringence of 2 nm/cm or lower.

The member obtained in accordance with the present invention is favorably employed in various types of apparatuses equipped with excimer lasers, particularly those for KrF or ArF excimer lasers; the member realizes a high resistance against laser radiation and homogeneity with high compatibility because hydrogen molecules are incorporated into the member at a high density and at a high homogeneity, and can be used stably for a long time as an optical member assembled in various types of apparatuses using the aforementioned excimer lasers. For instance, it can be suitably used as an optical member of an excimer laser stepper, a laser processing apparatus, a laser annealing apparatus, etc.

BRIEF DESCRIPTION OF THE DRAWINGS

FIG. 3 is a diagram showing the Table which gives the observed results obtained through the evaluation of various physical properties for the Examples and Comparative Examples.

MODE FOR CARRYING OUT THE INVENTION

Figure 1:
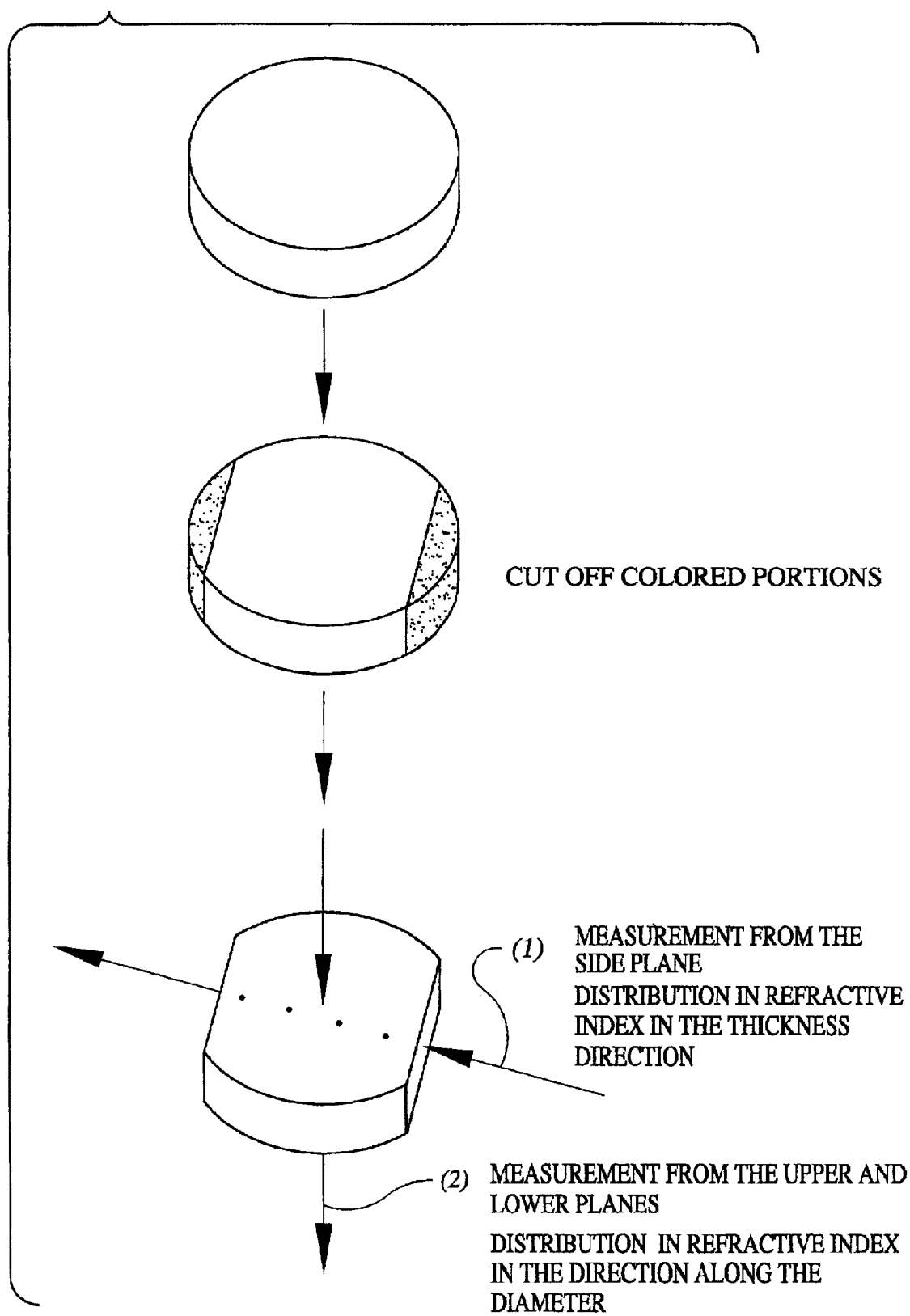
FIG. 1 is a diagram provided as an explanatory means to show the method for measuring the distribution in refractive index and the direction thereof.

In the process for producing a synthetic quartz glass member for excimer lasers according to the present invention, hydrogen molecules can be uniformly incorporated in quartz glass at a high concentration by applying heat treatment at a temperature not higher than 600° C. under a hydrogen-containing atmosphere of 1 atm or higher, while changing the pressure of the hydrogen-containing gas either stepwise or continuously. As a result, a quartz glass material for optics can be obtained with extremely high homogeneity and resistance against laser radiation. More specifically, while a treatment for a long time duration is necessary in order to diffuse hydrogen molecules at a high concentration into the quartz glass at a relatively low temperature, it is possible to incorporate hydrogen molecules at a high concentration by setting the pressure as high as 1 atm or higher, and, the hydrogen concentration distribution within the quartz glass can be positively controlled by further changing the atmosphere as to obtain a uniform hydrogen concentration profile. The production method according to the present invention comprises performing the treatment under a hydrogen atmosphere at a relatively low temperature and for a shorter process time. Accordingly, the formation of reductive defects which impairs the laser resistance can be prevented from being formed in quartz glass. Furthermore, by treating a quartz glass under a high pressure, the hydrogen molecules can be incorporated in the quartz glass at a high density as to result in a quartz glass having long term laser resistance. Moreover, by uniformly incorporating hydrogen molecules into the quartz glass, a product having refractive indices and laser resistance at an extremely high uniformity and stability can be obtained.

An embodiment according to the production method of the present invention is described in further detail below. In general, any type of quartz glass may be used in the present invention without any restriction. Representatively, suitably used are the synthetic quartz glass produced by indirect flame hydrolysis method (soot method) or by direct flame hydrolysis method (direct method). It is important that the residual gaseous hydrogen remaining in the quartz glass is degassed by subjecting the quartz glass to annealing prior to the treatment under a hydrogen-containing atmosphere. In general, almost no hydrogen molecules are present in a quartz glass obtained by soot method (most of them contain hydrogen molecules at a density of $1 \times 10^{16}$ molecules/cm$^3$ or lower), but those obtained by direct method frequently contain residual hydrogen molecules. Since the hydrogen molecules do not remain uniformly in the quartz glass, it is necessary to degas the hydrogen molecules in the quartz glass by annealing it prior to the hydrogen doping treatment under the hydrogen-containing atmosphere of the present invention to thereby realize uniform distribution for doped hydrogen. Furthermore, gaseous hydrogen that is incorporated into the quartz glass produced by direct method is generally introduced at high temperatures, and this leads to a high possibility of generating reductive defects in high quantity. Thus, in case of using quartz glass produced by direct method, degassing must be performed by heat treatment prior to doping hydrogen.

Treatment under a gaseous hydrogen atmosphere is performed in 100% gaseous hydrogen atmosphere, or in a mixed gas atmosphere containing hydrogen together with He or gaseous nitrogen. The size and the shape of the quartz glass to be subjected to the treatment under a gaseous hydrogen atmosphere are not particularly limited, however, since the hydrogen molecules are allowed to diffuse from the surface to the inside of the quartz glass, a long time is necessary in case of treating too thick a material. In practice, the quartz glass material is 50 mm or less in thickness, but is not particularly limited thereto.

The pressure for hydrogen treatment must be set to 1 atm or higher, but it should be adjusted in such a manner that a desired hydrogen concentration should be attained in the quartz glass. In case a high hydrogen concentration is required, the pressure for the treatment should be inevitably increased. However, in case the pressure is too high, it becomes difficult to control the pressure, and this leads to a difficulty in obtaining a uniform distribution in hydrogen concentration. Although depending on the shape and the size of the quartz glass to be treated, frequently selected as the condition is a pressure in a range of from about 5 atm to 100 atm. In the hydrogen treatment comprising maintaining the quartz glass for a predetermined duration of time, the hydrogen molecules are allowed to diffuse from the surface to the inside of the quartz glass. However, if the time is short, the hydrogen concentration in the vicinity of the surface is set higher than that in the inside. The shape of the distribution for the hydrogen concentration in the quartz glass depends on the shape of the sample, the treatment temperature, the time duration of the treatment, etc. In general, in case of a quartz glass plate with parallel planes (e.g., disk shapes as shown in FIG. 1), particularly in the vicinity of the outer peripheral portions, hydrogen diffusion occurs from the side planes; however, at portions somewhat inner from the outer periphery, the diffusion of hydrogen molecules headed to the direction of thickness becomes governing. In this manner, in general, a distinct distribution in hydrogen molecules generates in the direction of thickness. In case a distribution in hydrogen molecules is established in the thickness direction as to increase the hydrogen concentration in the vicinity of the surfaces of the parallel-planed plate, the refractive index is also increased as to make the distribution in refractive index no longer flat when viewed from the side plane. Such a material is not favorable when used in prisms or in various types of lenses in which high precision is required, because such a material affects the optical properties of the products. Accordingly, it is preferred that the hydrogen molecules are doped highly uniformly into optical quartz glass of high precision. However, a sufficiently long duration of time is necessary in case hydrogen molecules are uniformly doped under a constant pressure, and the process time increases in proportion to the second power of the thickness of the quartz glass. The present invention comprises properly changing the pressure of hydrogen treatment in case a high hydrogen concentration distribution is formed during the hydrogen treatment to thereby positively planarize the hydrogen molecule concentration within the quartz glass, without applying a treatment long enough until hydrogen molecules diffuse to form a uniform concentration distribution. In this manner, hydrogen molecules are uniformly doped with a short duration of time of the treatment to obtain a quartz glass body for optics having high homogeneity and a high laser resistance.

The pressure of the hydrogen-containing gaseous atmosphere is changed either continuously or stepwise. Although it is possible to finely control the hydrogen concentration distribution by continuously changing the pressure, in case of a quartz glass of a generally employed thickness, hydrogen can be uniformly doped therein by changing the pressure in about two or three stages without causing any substantial problem.

The temperature in case of performing the treatment under gaseous hydrogen is set to 600° C. or lower, and preferably, in a temperature range of from 200 to 400° C. If the treatment temperature should be too high, reductive defects increase as to impair the laser resistance; if the treatment temperature should be too low, the time necessary for the treatment becomes longer as to considerably impair the productivity. The reductive defects thus generated induce absorption bands in the vicinity of 215 nm in wavelength in case an ArF or a KrF laser is irradiated, and this considerably lowers the transmittance. The generation of reductive defects is closely related with the temperature or the time of treatment under gaseous hydrogen. In general, the treatment is preferably performed at a temperature as low as possible and in a short duration of time. However, the treatment conditions should be properly selected depending on the sample size and the desired concentration of hydrogen molecules.

The methods of evaluating the physical properties of the quartz glass obtained in accordance with the method of the present invention are described below.

1) Measurement of Hydrogen Concentration

The concentration of hydrogen contained in the quartz glass according to the present invention was measured in accordance with the method described in *Zhurnal Prikladonoi Spektroskopii* Vol. 46, No.6, pp. 987 to 991, June 1987. This method comprises using Raman scattering spectra, and the ratio of the band intensity of a Raman shift at 800 cm$^{-1}$ obtained for SiO$_2$ to that at 4137 cm$^{-1}$ obtained for hydrogen molecules incorporated in quartz glass. Thus, the hydrogen molecule concentration C (molecules/cm$^3$) is calculated according to the following equation:

$$C = K \times (I_{(4137)}/I_{(800)})$$

where, K is a coefficient used for matching the molecular weight of hydrogen with the absolute value measured by gas mass spectroscopy, and a value of $1.22 \times 10^{21}$ is used in the present experiment; and $I_{(4137)}$ and $I_{(800)}$ each represent the area intensity of the Raman bands observed at 4137 cm$^{-1}$ and 800 cm$^{-1}$, respectively. The hydrogen molecule concentration calculated by this equation represents the number of hydrogen molecules contained in quartz glass per volume of 1 cm$^3$.

As the apparatus, an Ar ion laser emitting a radiation 488 nm in wavelength equipped with double monochromator NR-1100 manufactured by JEOL was operated at a power output of 700 mW, in combination with a R943-02 photoelectron multiplier manufactured by Hamamatsu Photonics, Inc.

2) Distribution of Refractive Indices

A measurement method using Fizeau type interferometer was employed. The maximum and the minimum refractive indices (Δn) at a wavelength of 632.8 nm were measured. As shown in FIG. 1, in case of a disk-shaped quartz glass body, the distribution in refractive indices in the thickness direction is obtained when measured from the side plane, and the distribution in refractive indices along the direction of the diameter is obtained when measured from the upper and the lower planes. Referring to FIG. 1, the hatched portion is cut and the both planes are parallel cut in case of performing the measurement from the side plane of the disk-shaped quartz glass body.

3) Birefringence

For the measurement, an automatic birefringence measuring apparatus ADR-100 manufactured by Oak Seisakusho Co. Ltd. was used.

Figure 2:
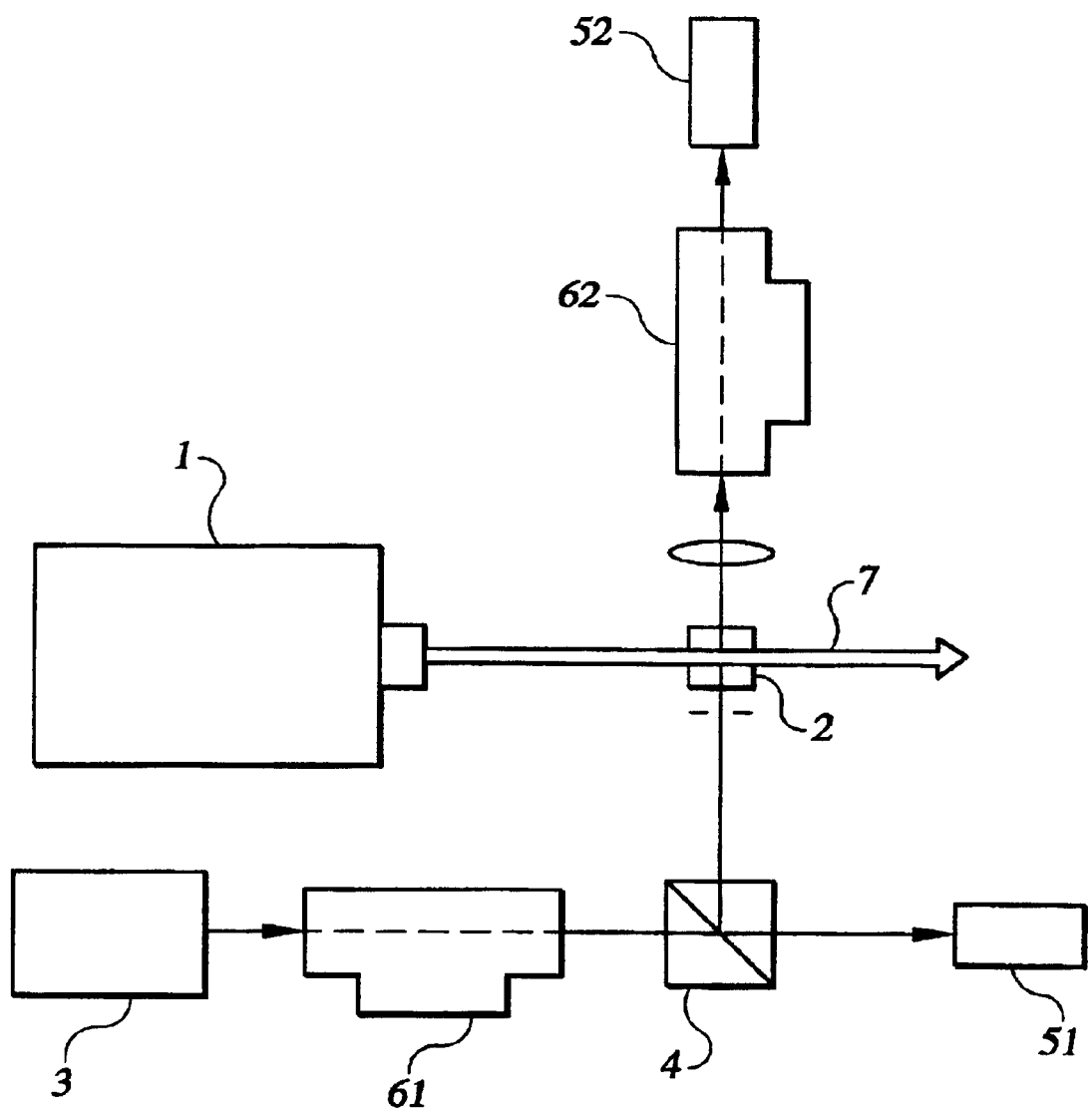
FIG. 2 is a schematically drawn diagram of an apparatus for measuring transmittance to evaluate a resistance against laser radiation.

4) Evaluation of Resistance Against Laser Radiation and the Apparatus Used for the Evaluation In FIG. 2 is shown a schematically drawn apparatus for use in the evaluation of resistances against ArF and KrF laser radiations. In case an excimer laser radiation is irradiated to a quartz glass having generated therein reductive defects by the treatment under gaseous hydrogen atmosphere, an absorption band having its center in the vicinity of 215 nm (210 nm in case of a KrF laser) in wavelength generates, and the transmittance for laser radiations decreases due to the overlapping of this band with the wavelength of 193 nm (ArF) or 248 nm (KrF). That is, the resistance against laser radiation can be evaluated by measuring the absorption at a wavelength of 215 nm. Since the absorption band above generates during the irradiation of a laser beam, and is relaxed when the irradiation is stopped, the measurement must be carried out while the laser beam is irradiated. In FIG. 2 is shown schematically an apparatus for measuring the transmittance in order to evaluate the resistance against laser radiation. Referring to the figure, the specimen to be evaluated 2 is generally shaped into a size of 10 mm×10 mm×50 mm, and the entire surface of the side plane (the plane 10 mm×50 mm in area) is mirror polished. Thus, while irradiating an excimer laser radiation having the predetermined energy density to the specimen 2, a light 215 nm in wavelength for measuring the transmittance is irradiated to the laser-irradiated portion from a direction making a right angle with respect to the laser beam, such that the absorbance for a light 215 nm in wavelength may be measured simultaneously with the irradiation of a laser radiation. The apparatus comprises a deuterium lamp 3 as the light source for ultraviolet radiation, a first monochromator 61 for monochromatizing the light to a monochromatic light 215 nm in wavelength, a first photomultiplier 51 for measuring the quantity of light of the incident light introduced through a beam splitter 4, and a photomultiplier 52 provided with the specimen incorporated therebetween, which is used for measuring the quantity of light passed through a second monochromator 62 and the specimen. The light irradiated from the deuterium lamp 3 is monochromatized by the first monochromator 61 into a monochromic light 215 nm in wavelength, and the 215-nm wavelength monochromatic light thus obtained is partly provided as an incident light to the photomultiplier 52 via the beam splitter 4, while the rest of the monochromatic light is received by the photomultiplier 52 via the specimen 2 and the monochromator 62. Thus, the transmittance can be obtained by taking the ratio of the quantity of light measured by the photomultipliers 51 and 52. In this case, the quantity of light received by the photomultipliers 51 and 52 is measured synchronized with the pulse generation of the excimer laser. Hence, the transmittance can be measured at the same time with the irradiation of the laser radiation. Here, the induced absorption at a wavelength of 215 nm with the irradiation of the laser radiation is expressed by the absorbance induced per 1 cm of the specimen. More specifically, the induced absorption D can be calculated in accordance with the equation as follows:

$D=-\mathrm{Log}$ (the transmittance while irradiating laser radiation/the transmittance before irradiating laser radiation)

In case of irradiating an ArF laser radiation at an irradiation energy density of 2 mJ/cm$^2$ per pulse, stable absorbance is realized at about $2 \times 10^5$ shots. Hence, the induced absorption is obtained by measuring the absorbance at this instance. In case of using a KrF laser, less damage occurs as compared with the case using an ArF laser. Hence, the irradiation energy density is set to 100 mJ/cm$^2$ per pulse.

EXAMPLES

The measured physical properties and brief conditions of production for the quartz glass bodies described in each of the Examples and Comparative Examples are given collectively in the table shown in FIG. 3.

Example 1

Fine particles of synthetic silica obtained by flame hydrolysis comprising introducing silicon tetrachloride into an oxyhydrogen flame were deposited as obtained on a rotating base body to obtain a porous silica preform (indirect flame hydrolysis method). Subsequently, the porous silica preform thus obtained was heated to 1600° C. or higher in a vacuum furnace under a high vacuum of $10^{-4}$ Torr in pressure to obtain a transparent ingot. The ingot thus obtained was maintained at a temperature of 1800° C. under nitrogen in an electric furnace equipped with a carbon heater, such that the ingot might be molten and shaped into a disk. The size of the shaped body was 260 mm in diameter and 60 mm in thickness. The outer surface of the thus obtained shaped body was cut to a depth of 10 mm to obtain a quartz glass body 240 mm in diameter and 40 mm in thickness. Then, to remove stress and for the homogenization of the quartz glass body thus obtained, the body was heated at 1150° C. for 50 hours in an electric furnace under air, and was gradually cooled thereafter to a temperature of 900° C. at a cooling rate of 5° C./hour. Then, the application of electric current to the furnace was cut to allow the quartz glass to cool naturally. The hydrogen concentration thus found on the quartz glass was below the detection limit; the homogeneity of the refractive index in the direction of thickness (as measured from the side plane) $\pm 1.2 \times 10^{-6}$ as expressed by the difference between the maximum and the minimum values of the refractive index ($\Delta$n), and the homogeneity of the refractive index in the direction of diameter (as measured from the upper and the lower planes) was $\pm 0.7 \times 10^{-6}$ as expressed by $\Delta$n.

In order to introduce hydrogen molecules into the shaped body thus obtained, heat treatment was performed in a hydrogen treatment furnace. The conditions of the treatment were set as such that the heating was maintained in an atmosphere containing 100% hydrogen molecules at a temperature of 350° C. under a pressure (p1) of 30 atm for a duration (t1) of 600 hours, followed by maintaining heating at 350° C. under a reduced pressure (p2) of 8 atm for a duration (t2) of 550 hours. The shaped body subjected to hydrogen treatment was then taken out from the furnace, and the homogeneity in refractive index was measured in the thickness direction as well as in the direction of the diameter. The differences between the maximum and the minimum values of the refractive index ($\Delta$n) in the thickness direction and the direction along the diameter were found to be $\pm 1.5 \times 10^{-6}$ and $\pm 0.9 \times 10^{-6}$, respectively, showing that a high homogeneity was maintained for the shaped body even after introducing hydrogen molecules. The birefringence in the thickness direction was measured to find a value of <1.5 nm/cm.

Then, samples for measuring the hydrogen concentration distribution and for evaluating laser resistance were cut out from the central portion of the thus obtained shaped body subjected to hydrogen treatment, on which the measurement of the hydrogen concentration distribution and the evaluation of the laser resistance were performed by using a Raman spectrometer and laser transmittance measuring apparatus. The hydrogen concentration distribution was small in the thickness direction; an average hydrogen concentration of $4.5 \times 10^{18}$ (molecules/cm$^3$) and a difference between maximum and minimum hydrogen concentration values ($\Delta$H$_2$) of $5.0 \times 10^{17}$ (molecules/cm$^3$) were obtained as a result.

Figure 4:
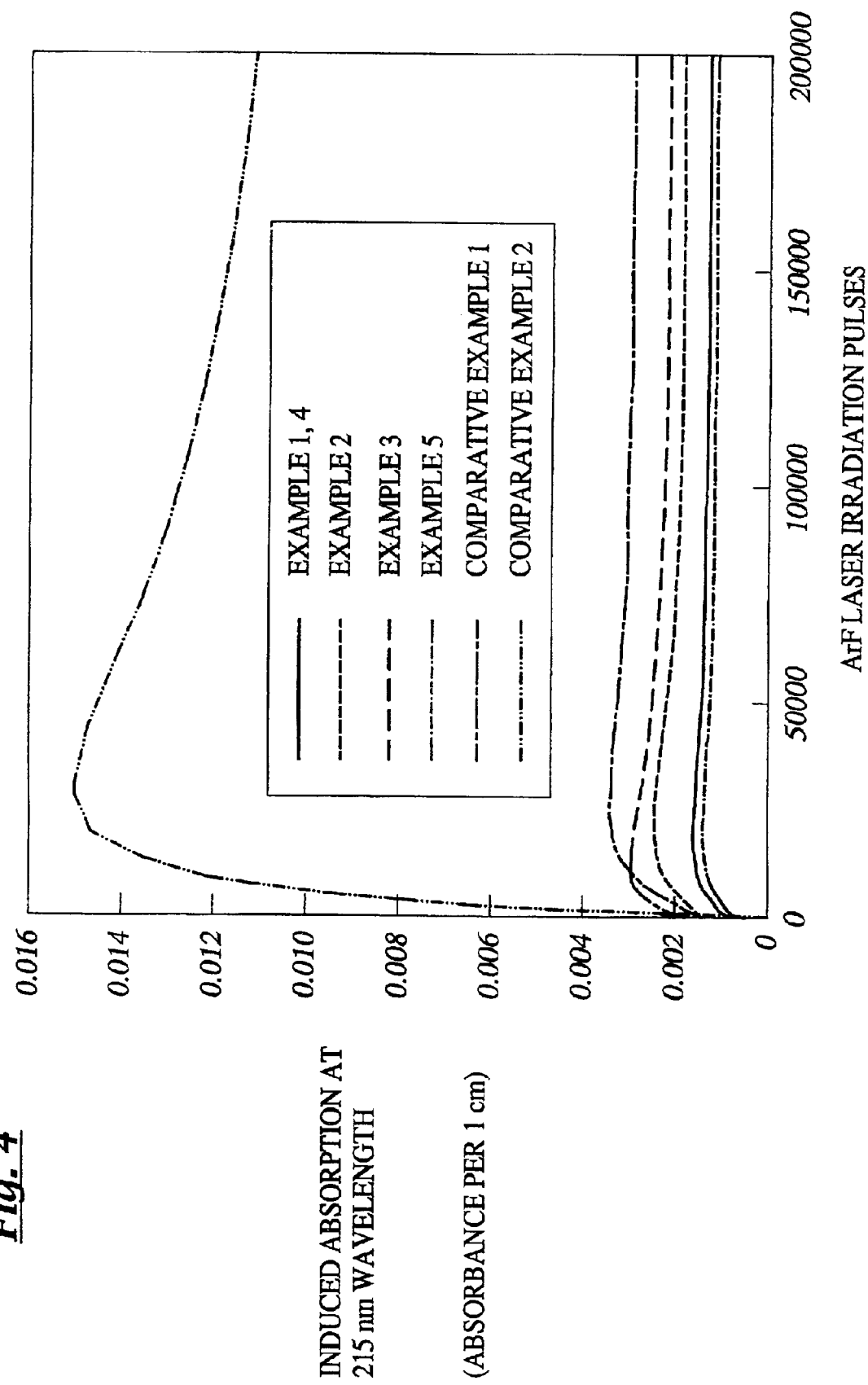
FIG. 4 is a diagram showing the change in absorbance obtained for a radiation 215 nm in wavelength with irradiating an ArF laser radiation in Examples and Comparative Examples.

In order to evaluate the laser resistance, a sample for evaluation was cut out from a portion in the vicinity of the central portion of the shaped body above, and the resistance thereof against the irradiation of ArF and KrF laser radiations was evaluated in accordance with the evaluation method described above. Thus, an induced absorbance of 0.0015 (/cm) was obtained at 215 nm in wavelength in case ArF laser radiation was irradiated $2 \times 10^5$ shots at an energy density of 2 mJ/cm$^2$ per pulse and at a frequency of 200 Hz. In FIG. 4 is shown the change in absorbance at 215 nm in wavelength in case ArF laser radiation was irradiated. Further, an induced absorbance of 0.0035 (/cm) was obtained at 210 nm in wavelength in case KrF laser radiation was irradiated $2 \times 10^5$ shots at an energy density of 100 mJ/cm$^2$ per pulse and at a frequency of 200 Hz. These values are sufficiently small as a quartz glass material for use in the optics for excimer lasers, and they show that the quartz glass material possesses high resistance against laser radiations.

Described above, the hydrogen molecules can be uniformly doped without generation of the concentration distribution of the hydrogen molecules by changing treatment pressure during treatment under high pressure hydrogen atmosphere. Therefore, the quartz glass for optics having high homogeneity of the refractive index and excellent resistance against laser radiation can be obtained. Evaluation results in Examples and Comparative Examples are summarized and shown in Table of FIG. 3.

Example 2

Fine particles of synthetic silica obtained by flame hydrolysis comprising introducing silicon tetrachloride into an oxyhydrogen flame were molten and deposited on a rotating base body to obtain an ingot of transparent glass body (direct flame hydrolysis method). Subsequently, the transparent glass ingot was maintained at a temperature of 1800° C. in an electric furnace equipped with a carbon heater under nitrogen to melt and shape the ingot into a disk. The size of the shaped body was 260 mm in diameter and 65 mm in thickness. Then, in order to once degas the hydrogen molecules initially contained inside the shaped body, the shaped body was maintained in an electric furnace in air at a temperature of 1150° C. for a duration of 250 hours. Subsequent to the heat treatment, the shaped body was gradually cooled to a temperature of 900° C. at a cooling rate of 5° C./hour in order to remove stress and for the homogenization, at which the electric current to the furnace was cut off to perform natural cooling. Then, the outer surface of the shaped body was cut to a depth of 10 mm to obtain a quartz glass body 240 mm in diameter and 40 mm in thickness. The hydrogen concentration thus found on the quartz glass body was below the detection limit; the homogeneity of the refractive index in the direction of thickness (as measured from the side plane) was $\pm 1.0 \times 10^{-6}$ as expressed by $\Delta n$, and the homogeneity in the direction of diameter (as measured from the upper and the lower planes) was $\pm 0.7 \times 10^{-6}$ as expressed by $\Delta n$.

In order to introduce hydrogen molecules into the shaped body thus obtained, heat treatment was performed in a hydrogen treatment furnace. The conditions of the treatment were set as such that the heating was maintained in an atmosphere containing 100% hydrogen molecules at a temperature of 400° C. under a pressure (p1) of 10 atm for a duration (t1) of 350 hours, which was followed by maintaining heating at 400° C. under a reduced pressure (p2) of 2.5 atm for a duration (t2) of 300 hours. The shaped body subjected to hydrogen treatment was then taken out from the furnace, and the homogeneity in refractive index was measured in the thickness direction as well as in the direction of the diameter. The differences between the maximum and the minimum values of the refractive index ($\Delta n$) in the thickness direction (as measured from the side plane) and the direction along the diameter (as measured from the upper and the lower planes) were found to be $\pm 1.2 \times 10^{-6}$ and $\pm 0.9 \times 10^{-6}$, respectively, showing that a high homogeneity was maintained for the shaped body even after introducing hydrogen molecules. The birefringence in the thickness direction was measured to find a value of <1.5 nm/cm. Similar to the case described in Example 1, hydrogen concentration distribution was measured and the laser resistance was evaluated for ArF and KrF excimer laser radiations. The average hydrogen concentration was found to be $1.7 \times 10^{18}$ (molecules/cm$^3$), and the difference between maximum and minimum hydrogen concentration values ($\Delta H_2$) was found to be $3.5 \times 10^{17}$ (molecules/cm$^3$). An induced absorbance of 0.002 (/cm) was obtained at 215 nm in wavelength in case ArF laser radiation was irradiated, and an induced absorbance of 0.0045 (/cm) was obtained at 210 nm in wavelength in case KrF laser radiation was irradiated. In FIG. 4 is shown the change in absorbance at 215 nm in wavelength with irradiating an ArF laser radiation. The values obtained above are sufficiently small as a quartz glass material for use in the optics for excimer lasers, and similar to the case described in Example 1, they show that the quartz glass material possesses high resistance against laser radiations.

Example 3

A transparent disk-shaped glass body 240 mm in diameter and 25 mm in thickness was prepared by using a method similar to those described in Example 2, comprising dehydrogenation thermal annealing of the quartz glass ingot obtained by direct flame hydrolysis. The hydrogen concentration thus found on the quartz glass body was below the detection limit; the homogeneity of the refractive index in the direction of thickness (as measured from the side plane) was $\pm 1.2 \times 10^{-6}$ as expressed by $\Delta n$, and the homogeneity in the direction of diameter (as measured from the upper and the lower planes) was $\pm 0.9 \times 10^{-6}$ as expressed by $\Delta n$.

In order to introduce hydrogen molecules into the shaped body thus obtained, heat treatment was performed in a hydrogen treatment furnace. The conditions of the treatment were set as such that the heating was maintained in an atmosphere containing 100% hydrogen molecules at a temperature of 350° C. under a pressure (p1) of 100 atm for a duration (t1) of 120 hours, which was followed by maintaining heating at 350° C. under a reduced pressure (p2) of 50 atm for a duration (t2) of 85 hours, and by then further maintaining heating at 350° C. under a reduced pressure (p3) of 25 atm for a duration (t3) of 135 hours. The shaped body subjected to hydrogen treatment was then taken out from the furnace, and the homogeneity in refractive index was measured in the thickness direction as well as in the direction of the diameter. The differences between the maximum and the minimum values of the refractive index ($\Delta n$) in the thickness direction (as measured from the side plane) and the direction along the diameter (as measured from the upper and the lower planes) were found to be $\pm 1.8 \times 10^{-6}$ and $\pm 1.5 \times 10^{-6}$, respectively, showing that a high homogeneity was maintained for the shaped body even after introducing hydrogen molecules. The birefringence in the thickness direction was measured to find a value of <2 nm/cm. Similar to the case described in Example 1, hydrogen concentration distribution was measured and the laser resistance was evaluated for ArF and KrF excimer laser radiations. The average hydrogen concentration was found to be $1.6 \times 10^{19}$ (molecules/cm$^3$), and the difference between maximum and minimum hydrogen concentration values ($\Delta H_2$) was found to be $1.2 \times 10^{18}$ (molecules/cm$^3$). An induced absorbance of 0.0023 (/cm) was obtained at 215 nm in wavelength in case ArF laser radiation was irradiated, and an induced absorbance of 0.0050 (/cm) was obtained at 210 nm in wavelength in case KrF laser radiation was irradiated. In FIG. 4 is shown the change in absorbance at 215 nm in wavelength with irradiating an ArF laser radiation. The values obtained above are sufficiently small as a quartz glass material for use in the optics for excimer lasers, and similar to the case described in Example 1, they show that the quartz glass material possesses high resistance against laser radiations.

Example 4

A shaped body was produced under the same conditions as those described in Example 1 except for using a mixed gas of gaseous helium and gaseous hydrogen in the heat treatment for doping hydrogen molecules. The conditions of the heat treatment for introducing hydrogen molecules in the first step were set as such that the heating was maintained in an atmosphere containing 100% gaseous hydrogen at a temperature of 350° C. under a pressure (p1) of 30 atm for a duration (t1) of 600 hours. In the second stage of treatment performed subsequently, a mixed gas of gaseous helium and gaseous hydrogen was employed. The partial pressure of gaseous helium and that of gaseous hydrogen was set to 22 atm and 8 atm, respectively, and the shaped body was maintained in the mixed gas of 30 atm for a duration of 550 hours at a temperature of 350° C. Similar to the case in Example 1, evaluations were made on the homogeneity, hydrogen concentration distribution, and laser resistance. Concerning homogeneity, the differences between the maximum and the minimum values of the refractive index ($\Delta n$)

in the thickness direction and the direction along the diameter were found to be $\pm 1.5 \times 10^{-6}$ and $\pm 1.0 \times 10^{-6}$, respectively, showing that a high homogeneity was maintained for the shaped body even after introducing hydrogen molecules. The birefringence in the thickness direction was measured to find a value of <1.5 nm/cm. The average hydrogen concentration was found to be $4.0 \times 10^{18}$ (molecules/cm$^3$), and the difference between maximum and minimum hydrogen concentration values ($\Delta H_2$) was found to be $4.0 \times 10^{17}$ (molecules/cm$^3$). An induced absorbance of 0.0015 (/cm) was obtained at 215 nm in wavelength in case ArF laser radiation was irradiated, and an induced absorbance of 0.0035 (/cm) was obtained at 210 nm in wavelength in case KrF laser radiation was irradiated, which results were both similar to those obtained in Example 1. In FIG. 4 is shown the change in absorbance at 215 nm in wavelength with irradiating an ArF laser radiation.

Example 5

A shaped body 240 nm in diameter and 50 mm in thickness was prepared by a method similar to that described in Example 1. In the heat treatment for introducing hydrogen molecules, the processing pressure was varied in three steps, and the processing pressure in the third step was set higher than that used in the second step. More specifically, the conditions of the heat treatment in the first step were set as such that the heating was maintained in an atmosphere containing 100% gaseous hydrogen at a temperature of 350° C. under a pressure (p1) of 30 atm for a duration (t1) of 550 hours, which was followed by the treatment in the second step in which heating was maintained at 350° C. under a pressure (p2) of 4 atm for a duration (t2) of 500 hours. In the third step, heating was performed under a pressure (p3) of 10 atm for a duration (t3) of 120 hours. Similar to the case in Example 1, evaluations were made on the homogeneity, hydrogen concentration distribution, and laser resistance. Concerning homogeneity, the differences between the maximum and the minimum values of the refractive index ($\Delta n$) in the thickness direction and the direction along the diameter were found to be $\pm 1.2 \times 10^{-6}$ and $\pm 0.9 \times 10^{-6}$, respectively, showing that a high homogeneity was maintained for the shaped body even after introducing hydrogen molecules. By setting the pressure of the hydrogen treatment in three steps, hydrogen molecules were homogeneously doped into a body with a relatively increased thickness, and it has been found that quartz glass having sufficiently high homogeneity can be obtained. The birefringence in the thickness direction was measured to find a value of <2 nm/cm. The average hydrogen concentration was found to be $3.0 \times 10^{18}$ (molecules/cm$^3$), and the difference between maximum and minimum hydrogen concentration values ($\Delta H_2$) was found to be $3.0 \times 10^{17}$ (molecules/cm$^3$). An induced absorbance of 0.0012 (/cm) was obtained at 215 nm in wavelength in case ArF laser radiation was irradiated, and an induced absorbance of 0.0032 (/cm) was obtained at 210 nm in wavelength in case KrF laser radiation was irradiated, which were quite low. In FIG. 4 is shown the change in absorbance at 215 nm in wavelength with irradiating an ArF laser radiation Comparative Example 1

A shaped body having the same size as that obtained in Example 1 was prepared by a method similar to that described in Example 1. The shaped body was prepared in the same method as that used in obtaining the shaped body in Example 1 before subjecting it to the treatment under hydrogen atmosphere. In order to dope hydrogen molecules into the shaped body, the shaped body was maintained at a treatment temperature of 400° C. for 600 hours in an atmosphere of 100% gaseous hydrogen under a pressure of 30 atm. Evaluations were made on the homogeneity, hydrogen concentration distribution, and laser resistance of the shaped body thus obtained. Concerning homogeneity, the differences between the maximum and the minimum values of the refractive index ($\Delta n$) in the direction along the diameter (as measured from the upper and the lower planes) was found to be $\pm 2.5 \times 10^{-6}$, which was slightly impaired, but the homogeneity $\Delta n$ in the thickness direction was found to be $\pm 1.8 \times 10^{-5}$, showing the formation of an extremely large distribution in the refractive index as compared with the Examples. The average hydrogen concentration was found to be $7.5 \times 10^{18}$ (molecules/cm$^3$), which was relatively high, but the distribution in the concentration of hydrogen ($\Delta H_2$) was extremely large as to yield $1.1 \times 10^{19}$ (molecules/cm$^3$); particularly, the hydrogen concentration was higher in the vicinity of the outer surface, and the distribution in refractive index thereby exhibited an abrupt increase in the vicinity of the surface. An induced absorbance of 0.003 (/cm) was obtained at 215 nm in wavelength in case ArF laser radiation was irradiated, and an induced absorbance of 0.007 (/cm) was obtained at 210 nm in wavelength in case KrF laser radiation was irradiated. These values are not particularly inferior. Since the pressure of the gas atmosphere was not changed during the hydrogen doping treatment, hydrogen was unable to diffuse deep inside the quartz glass in case the treatment duration was insufficiently small. Thus, a distinguished distribution in hydrogen concentration was developed, which resulted in a large distribution in refractive index.

Comparative Example 2

A shaped body was prepared in the same manner as that described in Example 1, except for changing the conditions of heat treatment for doping hydrogen molecules. More specifically, a quartz glass shaped body 240 mm in diameter and 40 mm in thickness was produced by an indirect method, and heat treatment was applied thereto under gaseous hydrogen atmosphere to introduce hydrogen molecules into the thus obtained shaped body. The conditions of the heat treatment were set as such that the heating was maintained in an atmosphere containing 100% hydrogen at a temperature of 650° C. under a pressure (p1) of 30 atm for a duration (t1) of 130 hours, which was followed by heating at the same temperature of 650° C. under a pressure (p2) set at 8 atm for a duration (t2) of 120 hours.

Measurements were made on the homogeneity, hydrogen concentration distribution, and laser resistance of the shaped body thus obtained. Concerning homogeneity, the differences between the maximum and the minimum values of the refractive index ($\Delta n$) in the direction along the diameter (as measured from the upper and the lower planes) and in the thickness direction and were found to be $\pm 1.0 \times 10^{-6}$ and $\pm 1.5 \times 10^{-6}$, respectively, showing favorable results. The average hydrogen concentration was found to be $4.0 \times 10^{18}$ (molecules/cm$^3$), and the distribution in the concentration of hydrogen ($\Delta H_2$) was $4.5 \times 10^{17}$ (molecules/cm$^3$), from which it was confirmed that the hydrogen molecules are introduced quite homogeneously. However, an induced absorbance of 0.013 (/cm) was obtained at 215 nm in wavelength in case ArF laser radiation was irradiated, and an induced absorbance of 0.031 (/cm) was obtained at 210 nm in wavelength in case KrF laser radiation was irradiated, which were considerably poor. In FIG. 4 is shown the change in absorbance at 215 nm in wavelength with irradiating an ArF laser radiation, and it can be read therefrom that an abrupt increase in absorption occurred on the sample obtained in Comparative Example 2. This is attributed to the generation of reductive defects in the quartz glass due to the heat treatment for doping for the hydrogen molecules performed at a higher temperature, and because absorption was thereby increased on irradiating laser radiation. Although there is no problem concerning the distribution of hydrogen concentration and homogeneity, poor laser resistance cannot afford its use for the optics of excimer lasers.

Advantage of the Invention

As described above, the present invention enables homogeneous doping of hydrogen molecules for improving the resistance of the quartz glass against excimer laser radiations, and hence, it realizes quartz glass members having high resistance against laser radiations without impairing the homogeneity in refractive index and optical properties such as birefringence. Thus, the quartz glass produced in accordance with the present invention exhibit laser resistance allowing its use stably and for a longer time even when utilized for high energy ultraviolet-emitting pulse lasers such as excimer lasers, and can be favorably used in lithography apparatuses for producing semiconductor devices and in other ultraviolet radiation optics.

| Description of the Reference Numerals and Signs | |
| --- | --- |
| 1 | Excimer laser |
| 2 | Sample |
| 3 | Deuterium lamp |
| 4 | Beam splitter |
| 51 | Monochromator |
| 52 | Monochromator |
| 61 | Photomultiplier |
| 62 | Photomultiplier |
| 7 | Excimer laser radiation |

What is claimed is:

1. A method for producing a synthetic quartz glass member said method comprising:

a step of incorporating hydrogen molecules into a synthetic quartz glass body by heat treating the synthetic quartz glass body at a temperature of 600° C. or lower in an atmosphere in a pressure range of 1 atm or higher but lower than 150 atm, said atmosphere containing hydrogen, the pressure of the atmosphere containing hydrogen being varied either continuously or stepwise in at least a part of the heat treatment; and wherein the pressure of the atmosphere containing hydrogen is decreased during said heat treatment in an amount in the range from 7.5 atm to 75 atm.

2. A method for producing a synthetic quartz glass member as claimed in claim 1, wherein the synthetic quartz glass body is heat treated in the atmosphere containing hydrogen for a first predetermined time duration under a first pressure setting, and is further heat treated for a second predetermined time duration under a second pressure setting that is lower than said first pressure setting.

3. A method for producing a synthetic quartz glass member as claimed in claim 1, wherein the atmosphere containing hydrogen consists of 100% gaseous hydrogen or a mixed gas containing hydrogen together with nitrogen, argon, or helium.

4. A method for producing a synthetic quartz glass member as claimed in claim 1, wherein the atmosphere containing hydrogen consists of 100% gaseous hydrogen or a mixed gas containing hydrogen together with nitrogen, argon, or helium.

5. A method for producing a synthetic quartz glass member as claimed in claim 1, wherein the synthetic quartz glass body in which hydrogen is incorporated is prepared by either a direct flame hydrolysis method or an indirect flame hydrolysis method.

6. A method for producing a synthetic quartz glass member as claimed in claim 1, wherein the pressure of the atmosphere containing hydrogen is decreased continuously in the heat treatment.

7. A method for producing a synthetic quartz glass member as claimed in claim 1, wherein the pressure of the atmosphere containing hydrogen is decreased stepwise in the heat treatment.

* * * * *